United States Patent
Sugimoto et al.

(10) Patent No.: US 6,243,933 B1
(45) Date of Patent: Jun. 12, 2001

(54) PIEZOELECTRIC RESONATOR AND METHOD FOR FABRICATING THE SAME

(75) Inventors: Masato Sugimoto; Katsu Takeda; Yoshihiro Tomita, all of Osaka; Osamu Kawasaki, Tsuzuki-gun, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/303,682

(22) Filed: May 3, 1999

Related U.S. Application Data

(62) Division of application No. 08/834,207, filed on Apr. 15, 1997.

(30) Foreign Application Priority Data

Apr. 16, 1996 (JP) .................................... 8-094000

(51) Int. Cl.[7] .................................... H04R 17/00
(52) U.S. Cl. .................. 29/25.35; 29/25.35; 29/593; 310/320; 310/321; 310/333; 310/359; 310/360; 310/368
(58) Field of Search .................. 29/25.35, 593; 310/320, 321, 333, 359, 360, 368

(56) References Cited

U.S. PATENT DOCUMENTS

| | | | |
|---|---|---|---|
| 3,763,530 | * 10/1973 | Helfen | 29/25.35 |
| 3,891,873 | * 6/1975 | Yanagisawa | 310/9.7 |
| 5,022,130 | * 6/1991 | EerNisse | 29/25.35 |
| 5,319,324 | 6/1994 | Satoh et al. | |
| 5,647,932 | 7/1997 | Taguchi et al. | |
| 5,668,057 | * 9/1997 | Eda | 438/113 |

FOREIGN PATENT DOCUMENTS

| | | |
|---|---|---|
| 59-210A | * 1/1984 | (JP) . |
| 1-158811 | 6/1989 | (JP) . |
| 5-102787A | * 4/1993 | (JP) . |
| 5-160659A | * 6/1993 | (JP) . |
| 7-206600 | 8/1995 | (JP) . |

* cited by examiner

*Primary Examiner*—Lee Young
*Assistant Examiner*—Paul D Kim
(74) *Attorney, Agent, or Firm*—Wenderoth, Lind & Ponack, L.L.P.

(57) ABSTRACT

A wafer with a reversed domain is prepared for two piezoelectric single crystal plates and of about the same thickness by using direct bonding without any adhesive. Driving electrodes are formed on two principal planes of the wafer with a reversed domain to provide a piezoelectric resonator. A piezoelectric resonator having the structure with a reversed polarization and using odd-order vibration modes vibrating with a fundamental wave has a wavelength of a thickness thereof and suppresses scattering of the thickness of the domains with a reversed polarization. In the direct bonding, the axes of the spontaneous polarization of the two piezoelectric single crystal plates are reverse to each other and crystalline axes other than the axes of polarization are shifted intentionally by an angle other than zero. Thus, spurious modes are suppressed in a simple way.

7 Claims, 15 Drawing Sheets

Posisson ratio $\sigma < 1/3$

Posisson ratio $\sigma > 1/3$

US 6,243,933 B1

PIEZOELECTRIC RESONATOR AND METHOD FOR FABRICATING THE SAME

This is a divisional application of Ser. No. 08/834,207, filed Apr. 5, 1997.

BACKGROUND OF THE INVENTION

1. Field of the Invention

The present invention relates to a piezoelectric resonator or filter and a method for fabricating the same.

2. Description of Prior Art

A piezoelectric resonator is used mainly as an oscillator or as a clock element in computers, various apparatuses with a microprocessor, and other various digital apparatuses. A piezoelectric resonator comprises a piezoelectric plate cut from a single crystal such as quartz or a piezoelectric ceramic and driving electrodes formed appropriately on the plate. The resonator uses strong resonance generated by applying a driving voltage to the driving electrodes at a frequency around the resonance frequency determined by the sound velocity and the size of the piezoelectric plate. The piezoelectric resonators are used widely because they have superior properties though they have a simple structure.

The resonator traps vibration energy below the driving electrodes, while it is fixed at portions outside the driving electrodes. Then, it can be mounted in a package or on a print circuit board without effecting vibrations. This type of resonators is called as energy trapping type resonator.

Recently, various information apparatuses such as a personal computer perform high speed processing. Then, it is demanded to increase clock frequency for information apparatuses and peripherals thereof such as hard disk drives and CD-ROM drives. For a frequency range from ten to a few tens of MHz used in these apparatuses, resonators use thickness vibration such as thickness shear vibration, thickness twist vibration or thickness-extensional vibration having vibration frequency in reverse proportion to the thickness of the piezoelectric material. As the frequency becomes higher, the piezoelectric material becomes thinner. For example, the thickness is 100 $\mu$m for frequencies exceeding 40 MHz. Then, various problems occur such as decrease in relative precision on forming, decrease in mechanical strength and increase in cost.

It is suggested in Japanese Patent laid open Publication 63-311808/1988 to form layers of lithium niobate with a reversed polarization in order make the thickness of the piezoelectric material for a particular frequency twice the counterpart in a previous resonator in correspondence to the frequency.

FIGS. 1A–1D show side views for illustrating processes for forming layers 102, 109 with a reversed polarization. A piezoelectric resonator 101 has driving electrodes 103 and 104 formed on opposing principal planes (top and bottom plane such as Z plane) 102a, 102b of a piezoelectric plate 102 cut from a lithium niobate single crystal.

In FIG. 1A, a wafer 105 is sliced from a lithium niobate single crystal subjected to poling, or the wafer 105 is sliced in a direction oblique by an appropriate angle relative to a polarization direction generated by the poling. A thin film 106 of titanium (Ti) is deposited on a plane of +c axis (or the top plane or +Z' plane in FIG. 1A) if the direction of the spontaneous polarization $P_S$ is in the direction of an arrow shown in FIG. 1A such as an upward direction.

Next, it is heated at a temperature between Curie temperature (about 1250° C.) of lithium niobate and 1100° C. to diffuse titanium in the titanium thin film 106 into the wafer 105, and a domain 109 with a reversed polarization is formed, as shown enlarged in FIG. 1B.

If the depth of the domain 109 with the reversed polarization is denoted as "t", surface charges generated in the wafer 105 under diffusion have a balanced state when the depth "t" is equal to a half of the thickness $T_3$ of the wafer 105. Then, the depth "t" of the domain 109 with the reversed polarization extending from the top plane stops to increase further at about a half of the thickness $T_3$ of the wafer 107, and the direction of the polarization $P_S'$ of the domain 109 becomes reverse to that of the polarization $P_S$. Next, as shown in FIG. 1C, a plurality of driving electrodes 103 and 104 are formed with patterning on the top and bottom planes of the wafer 107. Then, the wafer 107 is cut along dash and dot lines shown in FIG. 1C so that each element has the opposing electrodes 103 and 104. Thus, a piezoelectric resonator 101 shown in FIG. 1D is completed.

The piezoelectric plate 102 having the polarization $P_S$ and the reverse polarization $P_S'$ has a thickness about twice that of a prior art single domain piezoelectric resonator for the same frequency. For example, if the thickness of the prior art piezoelectric resonator is about 150 $\mu$m for vibration frequency of 26 MHz, that of the plate having the layers with a reversed polarization is about 300 $\mu$m. This is ascribed that half wavelength resonance is excited in the former while one wavelength resonance is excited for the latter.

For a resonator using lithium tantalate, as described for example in Japanese Patent 1-158811/1989, a proton exchange layer is formed for reversed polarization, and a part of the polarization is reversed selectively. The resonator also intends to enhance the upper limit of frequency twice, similarly to the above-mentioned lithium niobate resonator. FIG. 2A shows a piezoelectric plate 112 cut from a 0±10° rotation X plate of lithium tantalate single crystal which has a polarization $P_S$ directed from one principal plane (+X' plane) 112a to another principal plane (-X' plane) 112b. Then, as shown in FIG. 2B, a polyimide layer (mask) 113 of thickness of about 5 $\mu$m is applied to the +X' plane 112a by using for example spin coating. Then, as shown in FIG. 2C, it is immersed in a liquid for proton exchange processing heated at 250° for about one hour. Then, a proton exchange layer 115 is formed extending from the -X' layer 112b. Then, the piezoelectric plate 112 removed from the liquid 114 and cleaned is heated at a high temperature, for example between 560 and 610° C., below the Curie temperature of 620° C. of the lithium tantalate, for an appropriate time. Then, as shown in FIG. 2D, a layer 112c with a reversed polarization having spontaneous polarization $P_S'$ with a direction reverse to the polarization $P_S$ is formed from the -X' plane 112b to a half of the depth of the piezoelectric plate 112. Then, as shown in FIG. 2E, driving electrodes 116 and 117 are formed on the opposing principal planes (+X' and -X' planes) 112a and 112b. Thus, a piezoelectric resonator 111 is completed.

It is a problem for a resonator made of lithium niobate or lithium tantalate having a high Q and a large electromechanical coupling coefficient that spurious mode is liable to occur due to unnecessary vibration modes. Then, in order to excite a pure vibration mode, a resonator is fabricated by selecting a cut angle which forces thickness-extensional vibrations having principal displacement in the thickness direction and thickness shear vibrations having principal displacement parallel to the plate.

A thickness-extensional mode resonator couples weakly with other vibration modes. Then, by using this property, a resonator having small spuriouses inherently can be provided. When an optimum cut angle is selected for lithium niobate and lithium tantalate, the electromechanical coupling coefficient of thickness shear vibration mode is zero and only the thickness-extensional mode is excited. However, energy of first order wave (fundamental wave) is not trapped between the electrodes at the cut angle, and the resonator uses resonance of third order harmonic wave (third overtone) This is ascribed to the Poisson ratio of the lithium niobate or lithium tantalate being equal to or less than a third, and the first order resonance energy in the thickness-extensional mode cannot be trapped.

In the resonator using third order resonance, vibrations around the fundamental wave or the first order resonance are recognized as unnecessary vibrations or spuriouses. Therefore, if they are not suppressed sufficiently, vibrations of the fundamental wave are excited. Further, the third order resonance has worse properties than the first order resonance. On the other hand, there is a cut angle which excites not thickness-extensional mode, but only thickness shear mode.

A feature of the thickness shear mode different from the thickness-extensional mode is that two thickness shear vibrations perpendicular to each other exist at the same time in a plate excited with the thickness shear mode. Therefore, a resonator using the thickness shear mode has to contrive more to suppress spuriouses than that using the thickness-extensional mode.

A resonator using the thickness shear vibrations uses one of them as a main mode, and the other is recognized as unnecessary waves (spuriouses). Usually, an X-cut lithium tantalate uses a mode having faster sound velocity and a larger coupling coefficient as the main mode.

In order to suppress unnecessary waves due to width-extensional and length-extensional vibrations, it is also proposed that an element has a square size with sufficient room with respect to vibration space to damp spurious resonances with a sound absorbing material. However, if the absorbing material extends into the vibration space, the vibration characteristic is worsened remarkably. Then, this technique is not suitable for a small size element. On the other hand, Japanese Patent laid open Publication 5-160659/1993 proposes to provide an amorphous layer or an insulating layer at a side of an electrode. However, for a square element, the above-mentioned unnecessary waves having slow sound velocity are excited to a level about the same as the main waves. This situation is also observed similarly for a circular element.

In order to suppress the level of unnecessary waves having the slower sound velocity, it is also proposed to provide a rectangular element longer along the displacement direction of main vibrations. For an X-cut lithium tantalate plate having good temperature characteristics, the displacement direction of thickness shear vibration having a faster sound velocity (main vibration) is −53° (Nihon Denpa Kogyo Giho, No. 6, November, 1979). The displacement direction is denoted as an angle θ relative to the Y axis in FIG. 3A.

A strip resonator is proposed to provide a compact resonator having good performance. As shown in FIG. 3B, a strip resonator is a long parallelepiped having a rectangular section and has opposing electrodes 201 and 201' extending along the whole width. Thickness twist vibration mode propagating perpendicular to the displacement direction of the main vibration and thickness shear vibration having slower sound velocity are suppressed, and the resonator has high Q. In order to suppress spurious resonances in a strip resonator, it is preferable that the longitudinal direction of the strip piezoelectric resonator using X-cut lithium tantalate is generally parallel to the displacement direction of thickness shear vibration. For example, the most appropriate cut angle (θ relative to Y axis in FIG. 3A) is −50±20 (refer to Japanese Patent laid open Publication 1-36724/1989) or −57±0.5° (refer to Japanese Patent laid open Publication 2-13007/1990). The above-mentioned error range of the cut angle is about a few degrees, and this range is allowable because it is ascribed to crystalline symmetry and characteristics are not affected largely. Further, in the strip resonator, an appropriate ratio W/H of width W to height H and an appropriate ratio l/H of length l to height H are determined so that spurious resonances due to width or length do not overlap the thickness shear vibration mode as main vibration.

In order for the piezoelectric resonator 101, 111 subjected to polarization reversal processing to satisfy properties such as resonance frequency, resonance resistance, dynamic range and the like required for a resonator, it is necessary that the thicknesses of the layers with a reversed polarization are equal precisely to each other, that is, that the thickness of the layer with polarization $P_S$ is equal precisely to that of the layer with polarization $P_S'$. Further, the properties as a piezoelectric resonator are deteriorated if uniform layers of reversed polarization with no undulation are not formed in a wide range in the wafer 107, 112.

As mentioned above, in order to form layers with a reversed polarization, application of a titanium thin film or the like is needed. Therefore, there are various parameters such as thickness control, stress control and the like, and it is difficult to control the thickness of the layers with a reversed polarization precisely at the thickness of a half of the piezoelectric plate. Then, there are problems that properties such as resonance frequency, resonance resistance, dynamic range and the like required for a resonator become worse.

Further, because the processing temperature for forming the layers with a reversed polarization is as high as the Curie temperature, it is difficult to control the homogeneous temperature, and it is necessary to manage the environment in order to prevent isolation of lithium. It is also a problem that the plate is contaminated by the wall of the heating chamber, and this deteriorates the properties for a resonator.

Further, the preparation of the layers with a reversed polarization accompanies a change in composition such as a diffusion layer of titanium or migration of lithium. Then, the symmetry between a domain without reversal of polarization and the other domain with a reversed polarization becomes worse, and this deteriorates the properties of the resonator.

In order solve this problem, the inventors proposed a layered ferroelectric device with reversed polarizations by using direct bonding of ferroelectric plates in Japanese Patent laid open Publication 7-206600/1995. In this process, polarization is reversed easily, and properties are not deteriorated. However, the publication describes only a bonding process, and it does not describe or suggest how to use the ferroelectric plate for fabricating a ferroelectric (piezoelectric) resonator.

Further, even if a cut angle which excites only thickness-extensional vibration mode is selected for lithium niobate and lithium tantalate, there is a problem to be solved. Resonance energy of first order or fundamental wave is not trapped between the electrodes, and the resonator uses third order resonance. The coupling coefficient becomes a ninth because the coupling coefficient of n-th order resonance becomes $1/n^2$ for a higher order resonance. Because the characteristic of the resonator is proportional to the coupling constant, the resonator using the third order harmonic wave has worse characteristics than the resonator using the fundamental wave. Further, vibrations not trapped near the fundamental wave couple with other vibrations to generate forced vibrations of fundamental wave. Then, an element design is needed to operate a resonator of third harmonic wave properly. Further, for a square or circular element of a resonator of a thickness shear mode, the thickness shear wave (main wave) having faster sound velocity is excited at about the same level as the thickness shear wave (unnecessary wave) having a slower sound velocity.

Even if the resonator has a rectangular shape which is longer in the displacement direction of main wave, there is a limit to suppress slower unnecessary waves. Further, if a strip resonator is fabricated in order to suppress spurious resonances, the resonator has a shape of a long and narrow bar, and finishing of an end size thereof has a large influence on the vibration characteristics. Even if the end size is formed precisely, Q is deteriorated or new spurious resonances are generated if the end size has a bad cutting shape. Especially if the size of the resonator becomes thin for high frequencies, the width thereof becomes narrow, and this makes fabrication difficult and the resonator weak.

SUMMARY OF THE INVENTION

An object of the invention is to provide a piezoelectric resonator having a stable structure with a reversed polarization.

Another object of the invention is to provide a piezoelectric resonator having a structure to suppress spurious mode efficiently.

In one aspect of the invention, a piezoelectric resonator comprises two piezoelectric single crystal plates each having a spontaneous polarization and bonded directly to each other. Further, driving electrodes opposing to each other are formed on two principal planes of the piezoelectric single crystal plates bonded directly. In the directly bonded structure, the axes of the spontaneous polarization of the plates are reverse to each other and crystalline axes other than the axes of polarization are shifted by an angle other than zero to suppress spurious mode. For example, each of the piezoelectric single crystal plates is made of lithium niobate, lithium tantalate or lithium borate.

In another aspect of the invention, in a type of the piezoelectric resonator of the invention, a harmonic wave of an even order (for example second order) of thickness-extensional mode is excited by the driving electrodes.

For example, a direction of the crystalline axis perpendicular to the axis of the spontaneous polarization of one of the two piezoelectric single crystal plates is shifted by a non-zero angle within ±15° from that of the other of the two piezoelectric single crystal plates.

For example, the two piezoelectric single crystal plates have a Poisson ratio equal to or smaller than a third, an electro-mechanical coupling coefficient for thickness-extensional mode thereof is larger than that for thickness shear mode, and the driving electrodes are arranged to trap energy of even-order harmonic waves.

For example, the two piezoelectric single crystal plates are made of Z-cut lithium niobate or Z-cut lithium tantalate, and each of the driving electrodes has a length and a width between 2H and 7H where H denotes the thickness of the resonator.

For example, the piezoelectric resonator further comprises a supporting plate supporting the directly bonded piezoelectric single crystal plates. The supporting plate has two extension electrodes formed thereon, and each of the driving electrodes of the piezoelectric resonator is connected electrically to one of the extension electrodes with an electrically conducting adhesive. The extending direction and supporting direction of each of the extension electrodes agrees with the X axis of the piezoelectric single crystal plates.

In another type of the piezoelectric resonator of the invention, a harmonic wave of an even order (for example second order) of thickness shear mode is excited by the driving electrodes. For example, a direction of the crystalline axis perpendicular to the axis of the spontaneous polarization of one of the two piezoelectric single crystal plates is shifted by a non-zero angle within +15° from that of the other of the two piezoelectric single crystal plates.

For example, the two piezoelectric single crystal plates are made of X±10° rotation plate of lithium tantalate. One type of the thickness shear modes excited in the piezoelectric resonator having a larger electromechanical coupling coefficient is excited as a main wave in two types of the thickness shear vibration modes, while the other type thereof is suppressed. The directions of the spontaneous polarizations in the two piezoelectric single crystal plates are shifted by a non-zero angle within ±15°, to suppress unnecessary waves.

For example, the two piezoelectric single crystal plates are made of X±10° rotation plates of lithium tantalate, the driving electrodes are formed on parallel X±10° rotation planes thereof along a whole width, and a longitudinal direction of the two piezoelectric single crystal plates agree with a direction rotated by an angle between 38 and 58° clockwise from the Y' axis in the X'-Y' plane. The resonator further comprises a supporting plate supporting the directly bonded piezoelectric single crystal plates, the supporting plate having two extension electrodes formed thereon. Each of the driving electrodes of the piezoelectric resonator is connected electrically to one of the extension electrodes with an electrically conducting adhesive at an end along a longitudinal direction of the piezoelectric single crystal plates.

In a further aspect of the invention, in order to fabricate a piezoelectric resonator, two piezoelectric single crystal plates having spontaneous polarization are polished for planes thereof which are to be bonded to have mirror surfaces. Then, the polished planes are cleaned and made hydrophilic. Then, the cleaned planes to be bonded are contacted so that crystalline directions of the single crystal plates are shifted by an angle other than zero and that directions of the spontaneous polarization of the single crystal plates are reverse to each other. Then, the contacted single crystal plates are heated to bond the plates directly so as to integrate the two single crystal plates. Finally, two driving electrodes opposing to each other are formed on two principal planes of the integrated plates. For example, the two piezoelectric single crystals have the same thicknesses. If one or both of the two piezoelectric single crystals are thick, one or two sides of the integrated two piezoelectric single crystal plates are polished to match the thicknesses of the plates after the heating step. For example, the piezoelectric single crystal plates are made of a single crystal material of lithium niobate, lithium tantalate or lithium borate.

An advantage of the invention is that a piezoelectric resonator having good frequency precision can be provided at higher frequencies.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 4A:
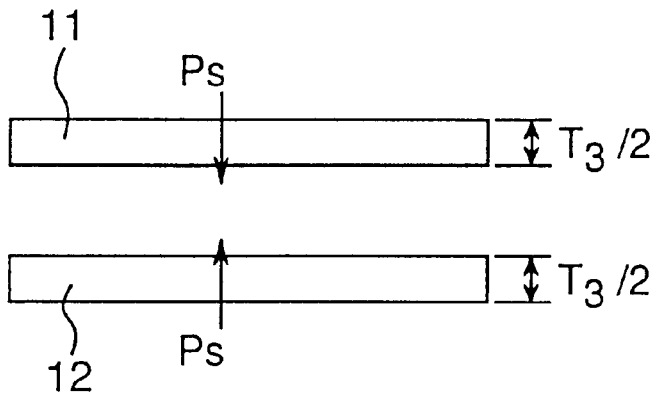
FIGS. 4A, 4B and 4C are side views for illustrating steps for fabricating a piezoelectric resonator according to a first embodiment of the invention.
Figure 4B:
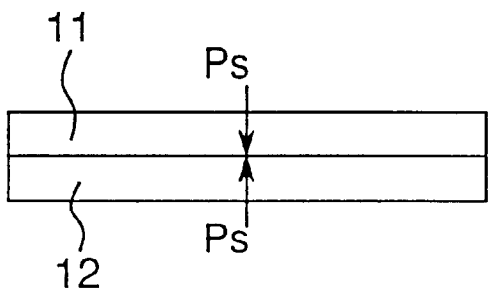
Figure 4C:
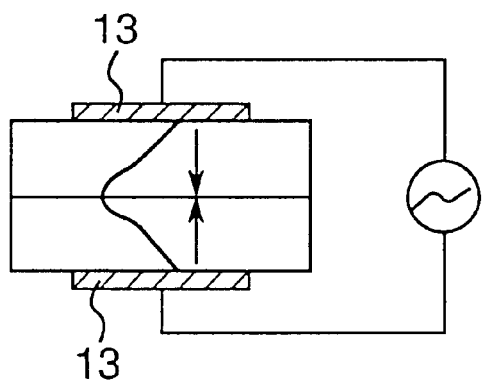

Referring now to the drawings, wherein like reference characters designate like or corresponding parts throughout the views, embodiments of the invention will be explained. FIGS. 4A–4C illustrate steps for fabricating a piezoelectric resonator according to a first embodiment of the invention. FIG. 4A shows a side view of two wafers 11, 12 of piezoelectric single crystals having the same thickness, wherein the direction of spontaneous polarization $P_S$ in the wafers is shown with an arrow. In the first embodiment, the piezoelectric single crystal wafers 11, 12 are Z-cut plates of lithium niobate $LiNbO_3$ which are two inches in diameter and 50 μm in thickness "$T_3/2$". As shown in FIG. 4B, these two piezoelectric single crystal wafers 11 and 12 are integrated with direct bonding. Because the bonding is performed without an adhesive agent, but with direct bonding where bonding is performed at an atomic level, elastic loss on propagation of bulk wave is very small. Then, when this integrated body is used for a resonator, mechanical quality coefficient Q is high and the resonator has high quality. Further, because the wafers are bonded at an atomic level, the direct-bonding interface has flatness similar to a mirror finish. Therefore, the thickness of the two regions with a reversed polarization is determined according to the precision of the thicknesses of the top and bottom side wafers 11 and 12. Because a ratio of the thicknesses of the wafers with a reversed polarization is constant over the entire wafer, a resonator using the wafers has good properties of resonance frequency, resonance resistance, dynamic range and the like. Further, because the mechanical strength of the direct bonding is very strong, it is also possible to decrease the thickness of the wafer by polishing, grinding or the like.

Next, the direct bonding process is explained in detail. In the direct bonding, two wafers to be bonded as a unitary integrated body are polished to form mirror surfaces and cleaned thereafter and are subjected to hydrophilic treatment on the surfaces. Then, the two wafers are contacted closely and heated. The heating temperature is sufficiently lower than the temperature for forming spontaneous polarization, or it is as low as 200 to 500° C. Therefore, troublesome control of temperature and environment is not needed, and the fabrication apparatus can be simplified. Further, the deterioration of the properties of the resonator due to high temperature treatment can be avoided. No bending or damage of the wafer and no deterioration of the material due to direct bonding are observed for lithium niobate used in this embodiment.

Figure 5:
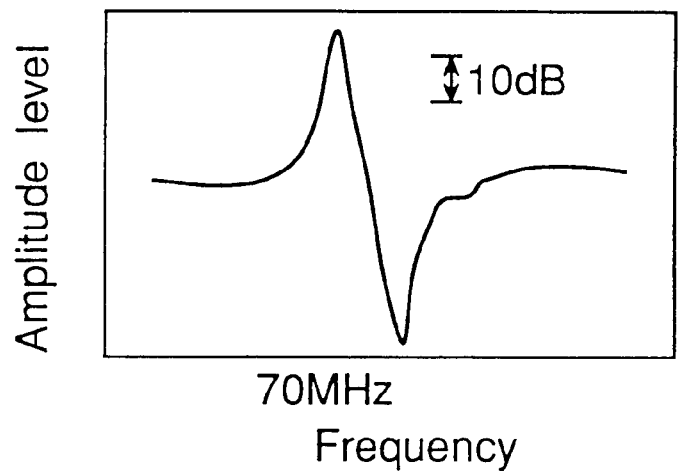
FIG. 5 is a graph of a frequency characteristic of the resonator.
Figure 6:
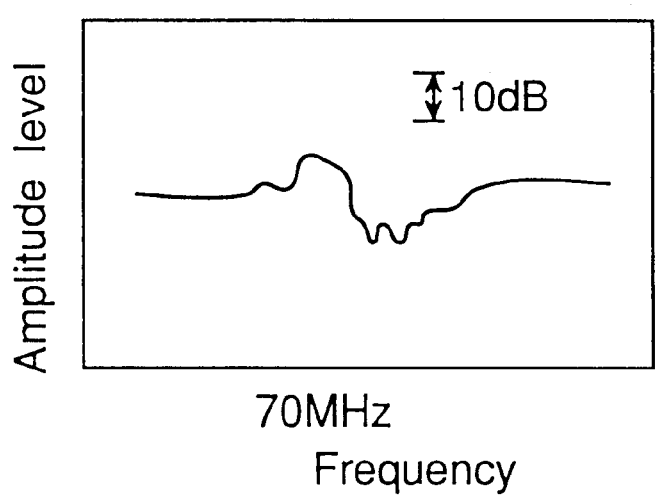
FIG. 6 is a graph of a frequency characteristic of a resonator of a comparison example.

However, if the mismatching of the crystalline axes exceeds ±15°, the properties become worse as shown in FIG. 5. Therefore, it is preferable that the mismatching is within ±15°. More preferably, if the mismatching is within ±3°, the properties are about the same as the best.

In this embodiment, the polarization axis is perpendicular to the plane of the wafers 11, 12, and this corresponds to the three-fold axis of symmetry of the single crystal. When bonding is performed with reversed polarization, it is preferable that the thermal expansion coefficient in the plane is matched. Then, the crystalline axes in the wafers are matched generally for bonding. However, even if the crystalline axes are not matched, the bonding strength is decreased only a little. Thus, there is no problem with the bonding, and the properties of the resonator are decreased only a little.

Finally, after the direct bonding, driving electrodes 13 are formed on the top and bottom planes of the unitary integrated body of wafers with a reversed polarization. Thus, as shown in FIG. 4C, a piezoelectric resonator is completed. An alternating voltage is applied to the electrodes 13. The above-mentioned direct-bonding piezoelectric structure can also be applied to a filter using piezoelectric properties.

Because the resonator is made by direct-bonding wafers having the same thickness, the bonding interface becomes the interface of reversed polarizations precisely at the position of a half of the thickness. The precision of the flatness of the interface of the wafers with a reversed polarization is good, as shown in FIG. 4C. Then, the resonance at one wavelength is excited in an ideal state, as shown in FIG. 5. Further, the resonance resistance is small, the dynamic range (that is, the difference between the maximum and the minimum of the amplitude level) is large, and spurious resonances are very unusual around the resonance frequency. In a prior art resonator made of one wafer, a half wavelength is excited in the thickness direction in the fundamental vibration mode, and the resonance frequency is about 36 MHz (theoretical value). In this embodiment, two wafers of thickness of 50 μm are bonded directly to fabricate a resonator of thickness of 100 μm, and the fundamental mode is second vibration mode where one wavelength is excited in the thickness direction. Thus, resonance frequency is about 72 MHz, twice that of the prior art resonator.

The resonator of the embodiment uses energy trapping in thickness-extensional vibrations. The resonator of energy trapping type explained above has properties which cannot be realized with a single piezoelectric wafer prepared without direct bonding (hereinafter referred to as single plate). This is explained below.

Figure 7A:
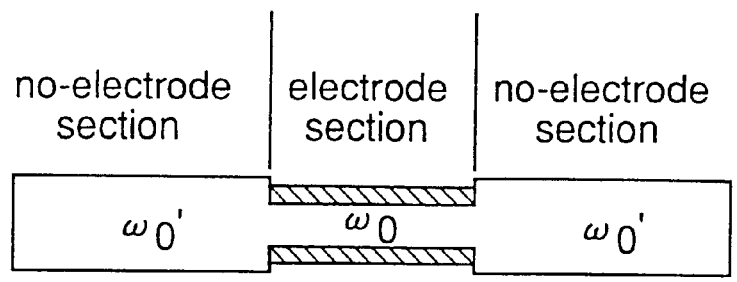
FIG. 7A is a schematic sectional view of a trapping type resonator.
Figure 7B:
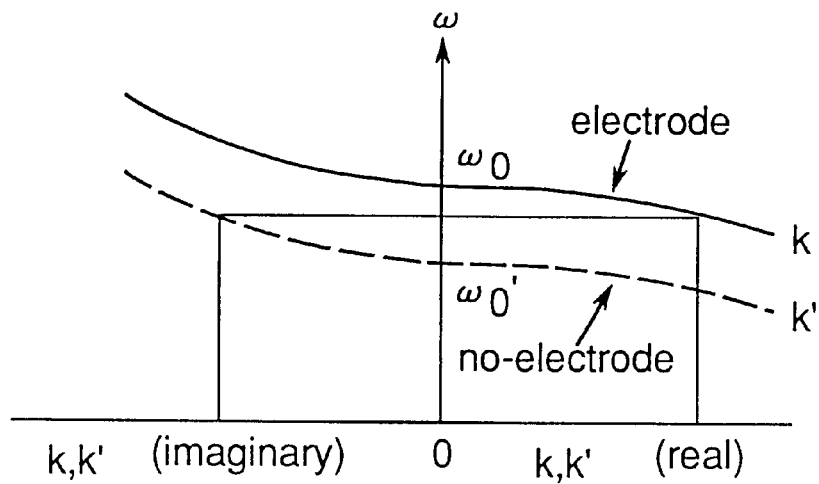
FIG. 7B is a graph of a dispersion curve.
Figure 8A:
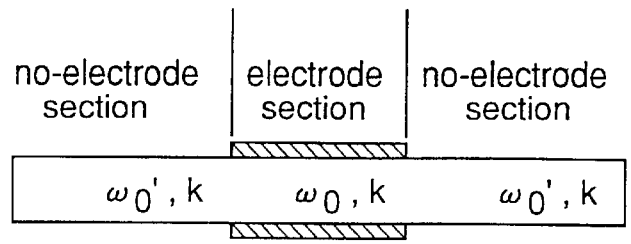
FIG. 8A is a schematic sectional view of another trapping type resonator.
Figure 8B:
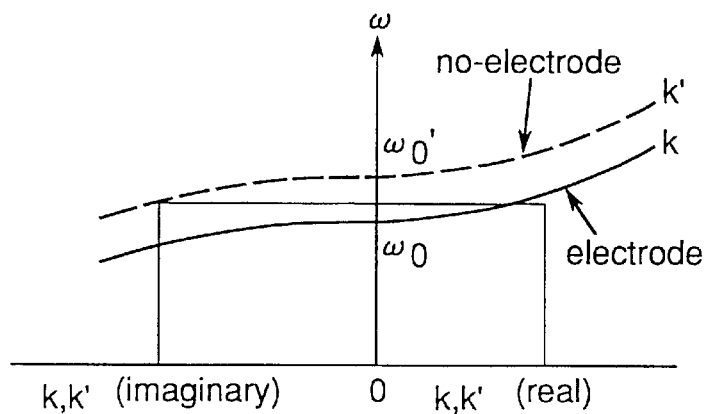
FIGS. 8B and 8C are graphs of dispersion curves.
Figure 8C:
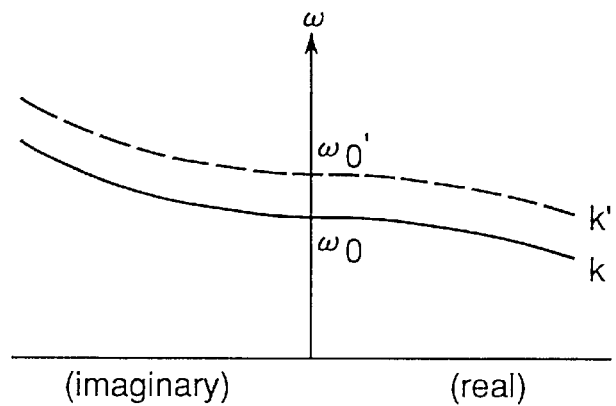

Usually, energy trapping in a piezoelectric resonator is realized by using energy trapping with plate thinning effect or with mass loading effect of electrode and plate back. FIGS. 7A and 7B show a structure of a piezoelectric resonator of energy trapping with plate thinning effect and a dispersion curve thereof having a Poisson ratio equal to or smaller than a third. FIG. 8A shows a structure of the piezoelectric resonator of energy trapping with mass loading effect of electrode and plate back, and FIGS. 8B and 8C show dispersion curves thereof of harmonics and of the main vibration wave. These are explained in detail in "Elastic Element Technology Handbook", Ohm, pp. 82–89. In FIGS. 7B, 8B and 8C, $\omega_o$ denotes angle frequency of thickness vibration waves such as thickness shear, thickness-extensional or thickness twist waves at the electrode section including two opposing electrodes (represented with hatching in FIGS. 7A and 8A), $\omega_o'$ denotes angle frequency of thickness vibration waves at no-electrode sections with no electrodes, κ denotes wave number along the plate in the electrode section, and κ' denotes wave number along the plate in the non-electrode sections. As shown in FIG. 7B, as to the main vibration of thickness vibration waves as in Z-cut lithium niobate having Poisson ratio equal to or less than a third, the wave numbers κ and κ' along the direction of the plate becomes imaginary at frequencies higher than the cut-off frequency $\omega_o$ and $\omega_o'$. On the other hand, for harmonic waves, as shown in FIG. 8B, wave numbers κ and κ' become imaginary at frequencies lower than the cut-off frequency $\omega_o$ and $\omega_o'$ In the structure shown in FIG. 8A, the boundary condition that κ is real and κ' is imaginary in a range between $\omega_o$ and $\omega_o'$ holds for harmonics. Therefore, energy is trapped in the electrode section. On the other hand, as shown in FIG. 8C, for the main vibration wave, the boundary condition that κ is real and κ' is imaginary in a range between $\omega_o$ and $\omega_o'$ does not hold, and it is difficult to take out vibration energy from the electrode section. In order to perform energy trapping of the main vibration, a boundary condition that κ is real and κ' is imaginary has to be realized by decreasing $\omega_o'$. Then, as shown in FIG. 7A, the thickness in the electrode section is narrowed. However, such a structure has to decrease the thickness of a part of the piezoelectric plate beside forming electrodes. Therefore, the productivity of the structure is worse, and fabrication itself is difficult for chemically stable materials such as lithium niobate or lithium tantalate LiTaO$_3$.

As explained above with reference to FIGS. 7A, 7B and 8A–8C, the fundamental wave vibration and the harmonics have different energy trapping type for vibration energy. Therefore, when the energy of one of the main vibration and the harmonics are trapped, that of the other leaks outside the electrodes or the other is suppressed. That is, in the structure shown in FIG. 8A, the energy of the fundamental wave (half-wavelength resonance) cannot be trapped, and the structure is used as a harmonic resonator which uses harmonics of third order or higher having smaller coupling coefficients than the fundamental wave. Usually, the energies of resonances of harmonics of 3, 5, 7, . . . , 2n+1 (where n is a natural number) are also trapped between the electrodes at the same time. However, the lowest order or third harmonic wave is generated because the frequency characteristic of the oscillator circuit is deteriorated at high frequencies for a piezoelectric material having a Poisson ratio equal to or less than a third. However, the suppression of the fundamental wave is actually not sufficient, and if forced vibrations occur in the fundamental wave region, the fundamental wave is generated.

On the other hand, in the piezoelectric resonator fabricated with direct bonding according to the first embodiment, energy trapping becomes possible for a second harmonic resonance having a coupling constant larger than the third harmonic (about the same as the fundamental wave because the two wafers relate to vibrations), and the fundamental wave is also suppressed sufficiently.

Figure 9:
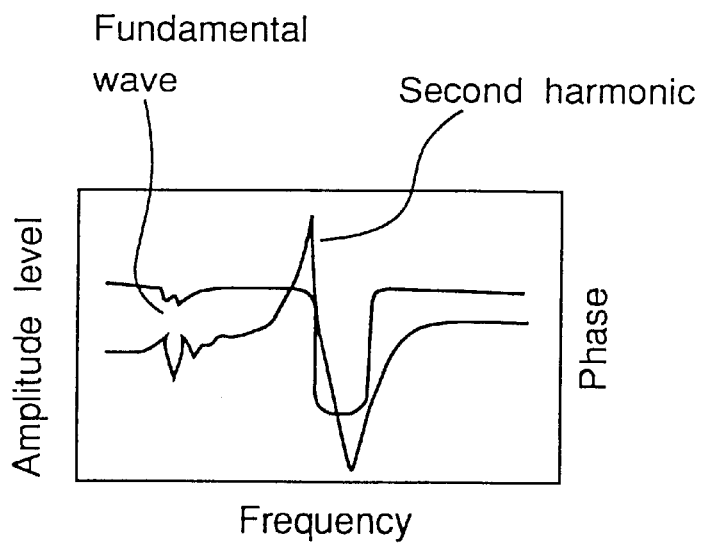
FIG. 9 is a graph of a frequency characteristic of the piezoelectric resonator.
Figure 10:
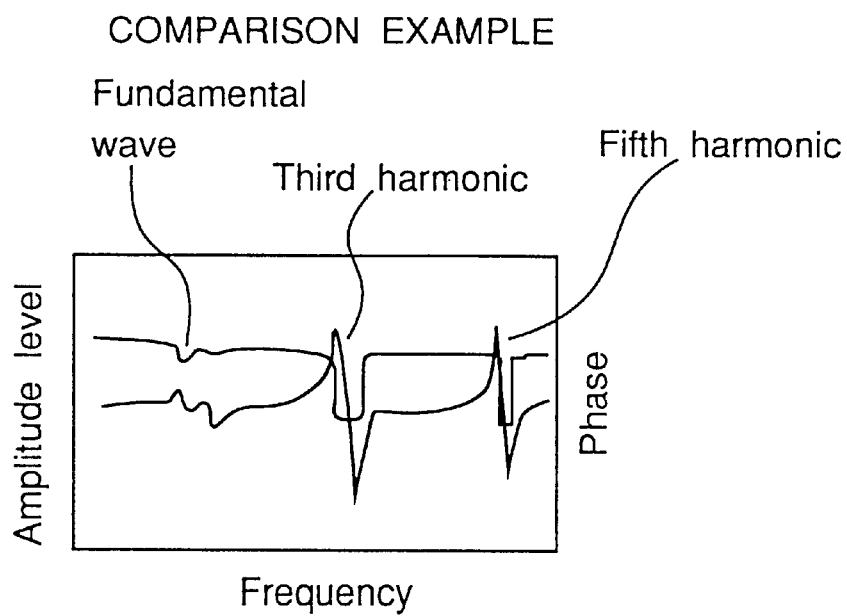
FIG. 10 is a graph of frequency characteristic of a prior art resonator.

FIG. 9 is a graph of a resonance characteristic around the main resonance of the piezoelectric resonator shown in FIG. 4C made of Z-cut lithium niobate wafers fabricated with direct bonding. On the other hand, FIG. 10 is a graph of frequency characteristic of a Z-cut single plate resonator. In the graphs, the abscissa represents amplitude level, and the ordinate represents the frequency. The attenuation becomes larger in the downward direction. In the characteristic curves, the curves having upward peaks represent the frequency characteristic, while the curves having downward peaks represent the phase characteristic.

As to the resonance frequencies in the Z-cut lithium niobate piezoelectric resonator of the first embodiment having a total thickness of 100 μm shown in FIG. 9, the peak for the second harmonic of thickness-extensional vibrations is more evident than the peak for the resonance of the fundamental wave.

On the other hand, as to the resonance frequencies in the Z-cut single plate lithium niobate piezoelectric resonator, energy trapping of the fundamental wave (half wavelength resonance) having the largest coupling coefficient is not realized, as shown in FIG. 10. Main resonances occur at high frequency regions of third or higher order harmonics.

As explained above, the coupling coefficient becomes larger and the worsening of the characteristics becomes smaller with decrease in the order of harmonic waves. Then, by comparing the characteristics of the lowest excited order as shown in FIGS. 9 and 10, it is found that the piezoelectric plate prepared with direct bonding of Z-cut lithium niobate has higher performance because the vibration mode of lower order which cannot be realized in the single plate piezoelectric plate can be trapped.

In the first embodiment explained above, piezoelectric single crystal wafers of the same thickness are bonded. However, similar advantages are realized for a resonator made of piezoelectric single crystal wafers of thicknesses different somewhat from each other.

The Z-cut plate is used in the first embodiment because the coupling constant of thickness shear vibrations excited by the driving electrodes opposed to each other is small and the energy trapping of the fundamental wave is impossible because the Poisson ratio is equal to or smaller than a third. However, a 36° Y-cut plate having similar characteristics can also be used and similar advantages are obtained. Lithium tantalate or lithium borate ($Li_2B_4O_7$) can also be used similarly instead of lithium niobate explained above.

Further, in the first embodiment shown in FIGS. 4A–4C, a fabrication method for fabricating one piezoelectric resonator is explained. In a modified embodiment, after two wafers having a large area are bonded directly, a plurality of driving electrodes are formed together. Then, the bonded wafers are cut to form a large number of resonators at the same time.

Figure 11A:
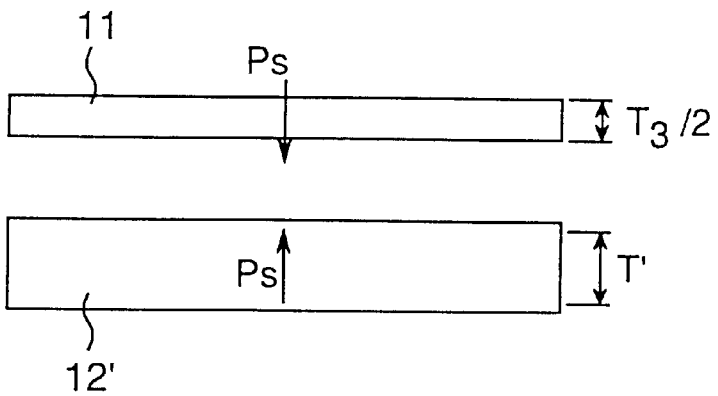
FIGS. 11A, 11B and 11C are side views for illustrating steps for fabricating a piezoelectric resonator according to a second embodiment of the invention.
Figure 11B:
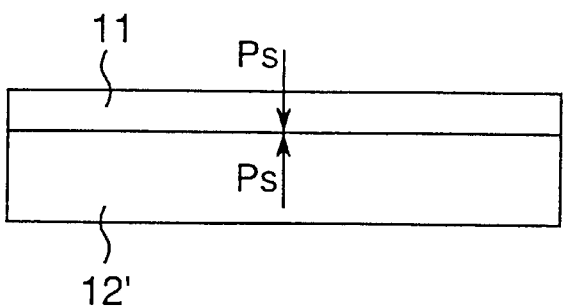
Figure 11C:
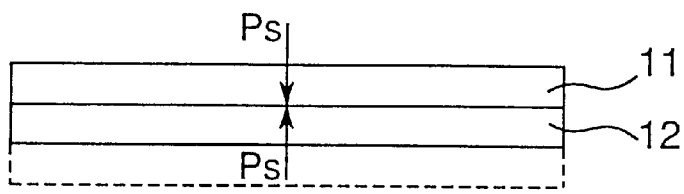

FIGS. 11A–11C are side views of a piezoelectric resonator according to a second embodiment of the invention. FIG. 11A is a side view of two piezoelectric single crystal wafers 11, 12' having different thicknesses from each other. The piezoelectric single crystal wafer 11 is a Z-cut lithium niobate $LiNbO_3$ having a diameter of two inches and thickness "$T_3/2$" of 50 µm, and another wafer 12' is a Z-cut $LiNbO_3$ of the same size as the former except that the thickness T' is 100 µm. The two wafers 11, 12' to be bonded are polished to form mirror surfaces and cleaned thereafter, and they are subjected to hydrophilic treatment on the surfaces.

Next, as shown in FIG. 11B, they are subjected to direct bonding to be integrated as a unitary body. The heating temperature is sufficiently lower than the temperature for forming spontaneous polarization, or as low as 200 to 500° C. When bonding is performed with reversed polarization, it is preferable that the thermal expansion coefficient in the plane is matched. Then, the crystalline axes in the plane are matched generally for bonding. However, even if the crystalline axes are not matched, the bonding strength is decreased only a little, and there is no problem with the bonding, and the properties of the resonator are deteriorated only a little.

Figure 1A:
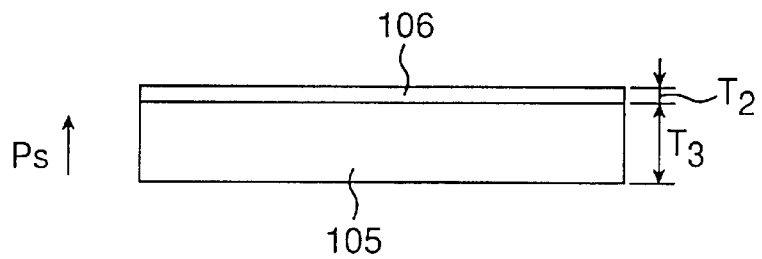
FIGS. 1A, 1B, 1C and 1D are side views for illustrating steps for fabricating a prior art piezoelectric resonator with reversed polarization.
Figure 1B:
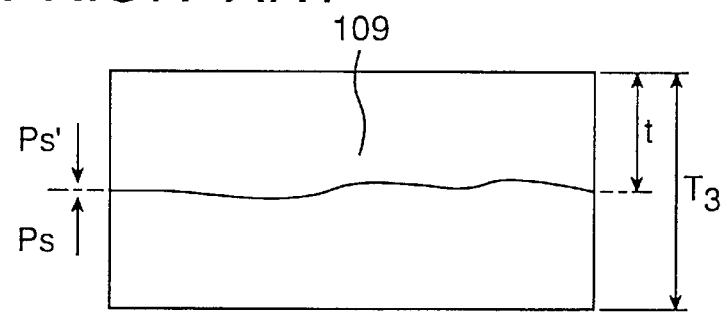
Figure 1C:
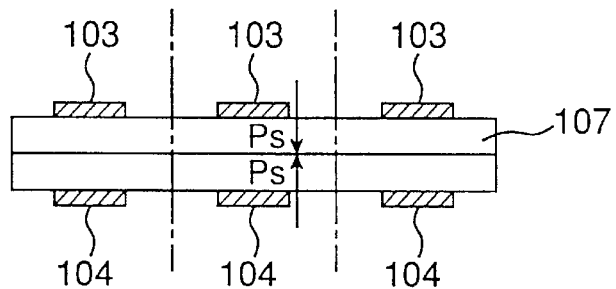
Figure 1D:
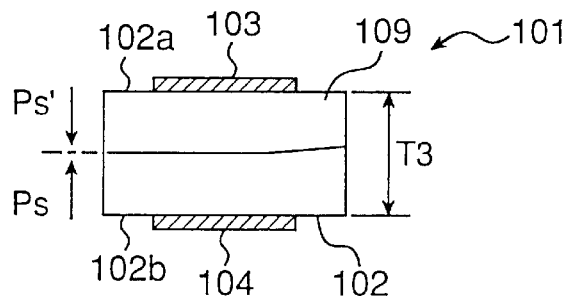
Figure 2A:
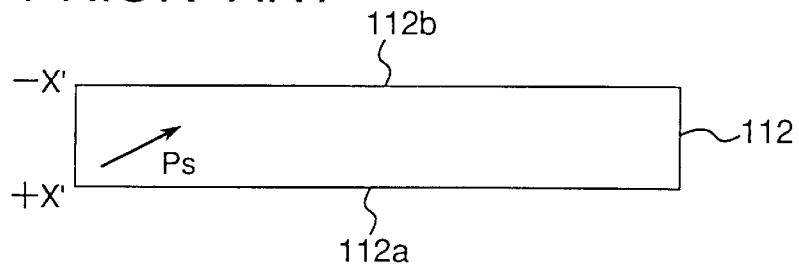
FIGS. 2A, 2B, 2C, 2D and 2E are side views for illustrating steps for fabricating a prior art piezoelectric resonator with reversed polarization.
Figure 2B:
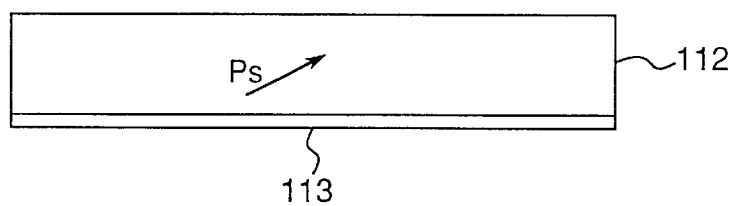
Figure 2C:
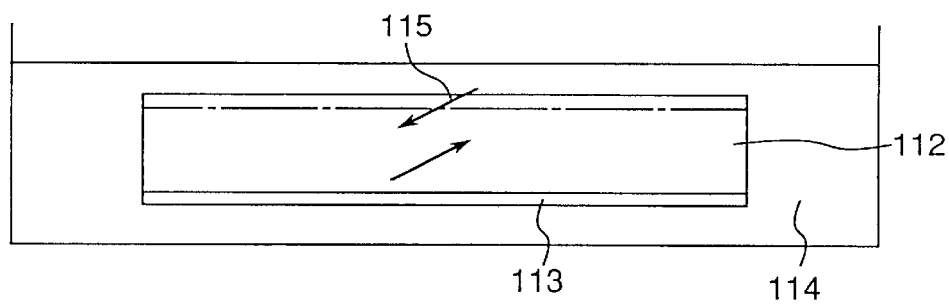
Figure 2D:
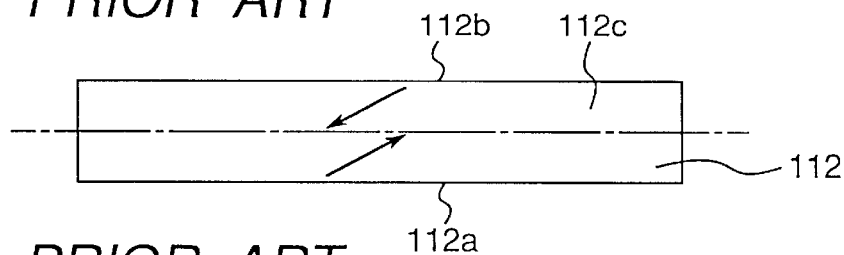
Figure 2E:
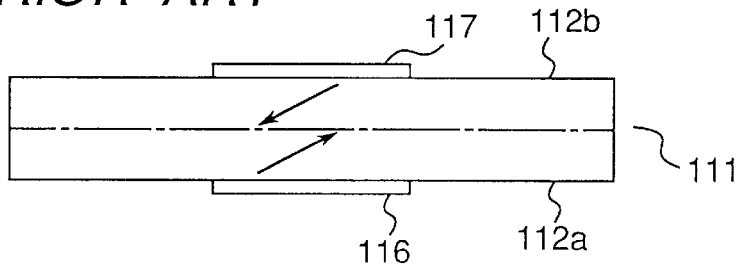
Figure 3A:
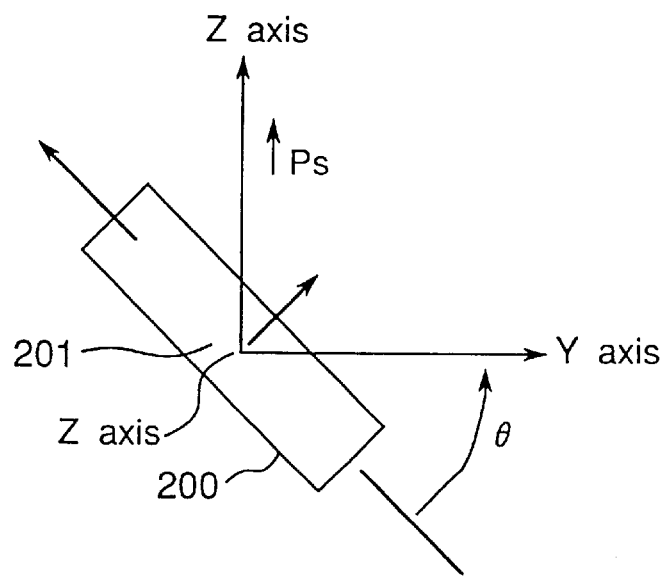
FIGS. 3A and 3B are a top plan view and a perspective view of a prior art resonator.
Figure 3B:
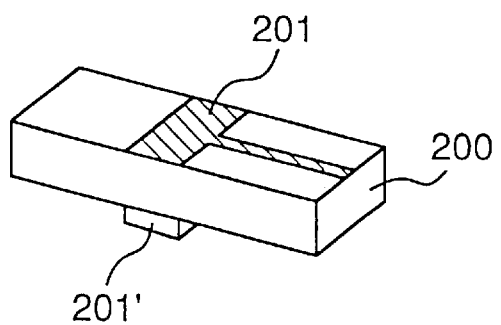

Then, as shown in FIG. 1C, the thicker wafer 12' at the bottom side is polished to decrease its thickness.

Finally, after the direct bonding, driving electrodes 13 are formed on the top and bottom planes of the integrated wafers with a reversed polarization, and similarly to FIG. 5, a piezoelectric resonator is completed. Because the resonator is made by bonding a thick wafer to a thin waver, the whole thickness before polishing is thick, and the mechanical strength is large. Thus, the handling becomes easy.

In the processes shown in FIGS. 11A–11C, fabrication of one piezoelectric resonator is explained. However, in a modified example, wafers having a large area are bonded directly, and a plurality of driving electrodes are formed together. Then, the bonded wafers are cut to form a large number of resonators at the same time.

In the second embodiment, lithium niobate is used for the piezoelectric single crystal wafers. However, needless to say, similar advantages are observed when a different piezoelectric single crystal material such as lithium tantalate or lithium borate is used.

Figure 12A:
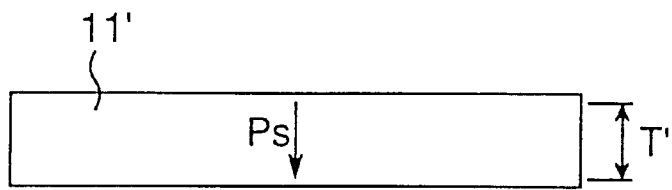
FIGS. 12A, 12B and 12C are side views for illustrating steps for fabricating a piezoelectric resonator according to a third embodiment of the invention.
Figure 12B:
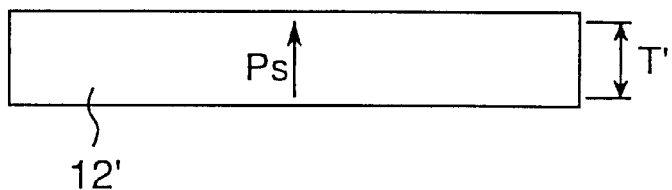
Figure 12C:
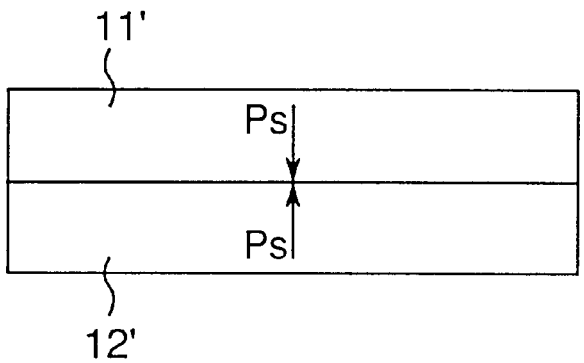

FIGS. 12A–12C are side views of a piezoelectric resonator according to a third embodiment of the invention for illustrating a fabrication process of the piezoelectric resonator. FIG. 12A is a side view of two piezoelectric single crystal plate wafers 11',12' having about the same size. The piezoelectric single crystal wafers 11', 12' are Z-cut $LiNbO_3$ having diameter of 3 inches, and a thickness "T'" of 100 µm. Next, as shown in FIG. 12B, they are subjected to direct bonding to be integrated to form a wafer with a reversed polarization. Then, as shown in FIG. 12C, the two planes 11', 12' of the wafers are polished to form wafers 11, 12 having desired thicknesses. Finally, after the polishing or lapping, driving electrodes 13 (not shown) are formed on the top and bottom planes of the wafers 11, 12 with reversed polarization. Thus, a piezoelectric resonator is completed.

Because the resonator is made by bonding the thick wafer 11' to the other thick wafer 12', the total thickness before polishing is thick, and the mechanical strength is large. Thus, the handling is easy. Further, because the thick wafers can be polished precisely, the precision of the thickness is improved by polishing after bonding the thick wafers. Further, because the polarity of the plane to be bonded is the same in the two piezoelectric plates, the crystalline property thereof is also the same (or there is no change in crystalline composition due to diffusion of titanium or the like as in the prior art). It is also advantageous that the polishing rate becomes equal for the two planes.

There is no restriction on the cut angle of the plates. If the direct bonding is performed with opposite polarization axes, resonance of one wavelength is observed in the desired mode. The specifications such as the temperature characteristic, the coupling coefficient and the like required for a product can be easily selected appropriately.

In the embodiment shown in FIGS. 12A–12C, one piezoelectric resonator is fabricated. However, in a modified embodiment, after wafers having a large area are bonded directly, a plurality of driving electrodes are formed together. Then, the bonded wafers are cut to form a large number of resonators at the same time.

In this embodiment, lithium niobate is used for a piezoelectric single crystal. However, needless to say, similar advantages are observed when a different piezoelectric single crystal material such as lithium tantalate or lithium borate is used.

As explained above, the piezoelectric resonator can extend the upper limit of frequency by using direct bonding. It is also possible to provide a piezoelectric resonator in the thickness-extensional vibration mode which could not be provided previously. However, the energy trapping type piezoelectric resonator has to solve the following contradicting conditions: If a crossing width of the driving electrodes becomes too wide, vibrations referred to as inharmonic overtone are excited as spuriouses, whereas if it becomes too narrow, sufficient energy is not trapped and the characteristics of the resonator becomes worse. Therefore, it is necessary to optimize the crossing width of the driving electrodes. The crossing width is determined experimentally. The crossing width is defined with a diameter of a circular electrode.

Figure 13:
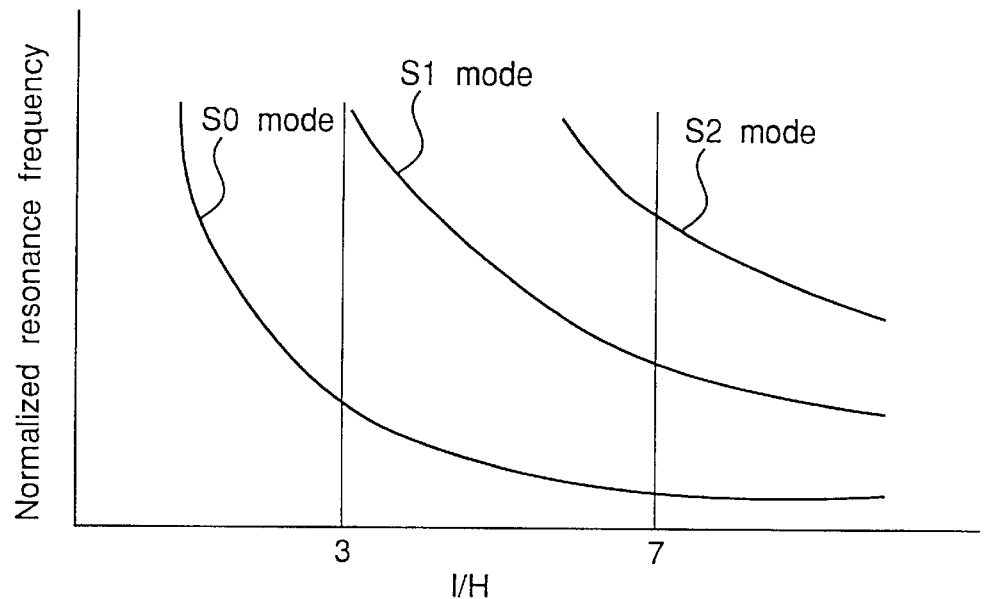
FIG. 13 is a graph for explaining a relation of crossing width of driving electrodes and anharmonic higher order modes.
Figure 14A:
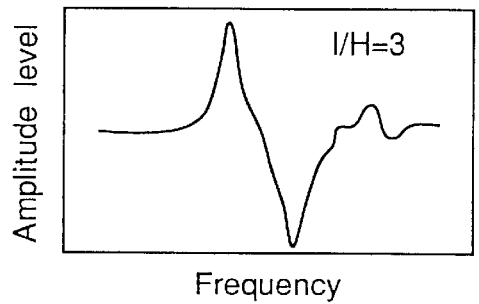
FIGS. 14A, 14B, 14C and 14D are graphs of frequency characteristics for four crossing widths of driving electrodes.
Figure 14B:
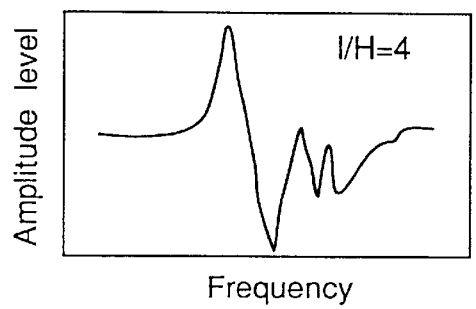
Figure 14C:
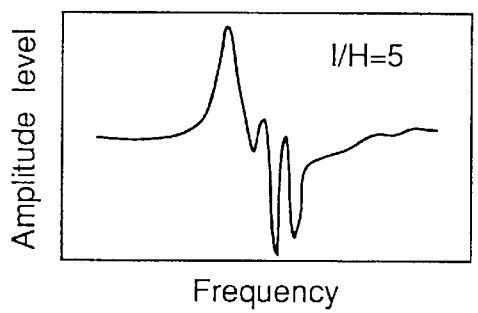
Figure 14D:
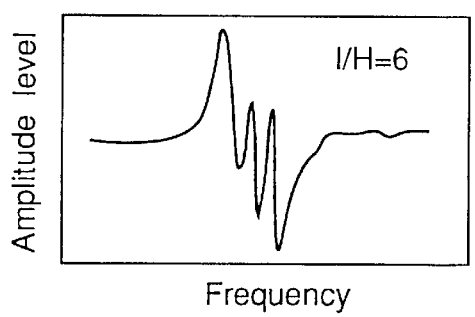

FIG. 13 shows a graph for explaining a relation of the crossing width of the driving electrodes to spurious frequency of the piezoelectric resonator fabricated by using the processes of the first embodiment. The ordinate represents the crossing width "l" of the driving electrodes normalized with the thickness "H" of the resonator, while the abscissa represents spurious frequency normalized with the resonance frequency. FIGS. 14A–14D show experimental data for cases of l/H of 3, 4, 5 and 6. As shown in FIGS. 13 and 14A–14D, as the crossing width increases, spurious resonances Si and S2 due to anharmonic modes appear near the main resonance. This is intrinsic for an energy trapping type resonator, and this is also evidence that second harmonic is trapped well.

By optimizing the crossing width of the driving electrodes, a piezoelectric resonator which is not affected largely is provided. As shown in FIGS. 14A–14D, the single mode (a mode without spuriouses) is excited practically for l/H equal to or smaller than 3. Optimum crossing width is determined experimentally by changing l/H. The level difference between the main resonance and the S1 mode or the most adjacent spurious resonance is equal to or smaller than 10 dB in a range of 2<l/H<7, and good spurious characteristics are observed in the range.

The resonator explained above has good reproducibility. Then, the conditions for good spurious characteristics become clear, and it is confirmed that resonators having the same characteristics can always be fabricated stably.

Figure 15:
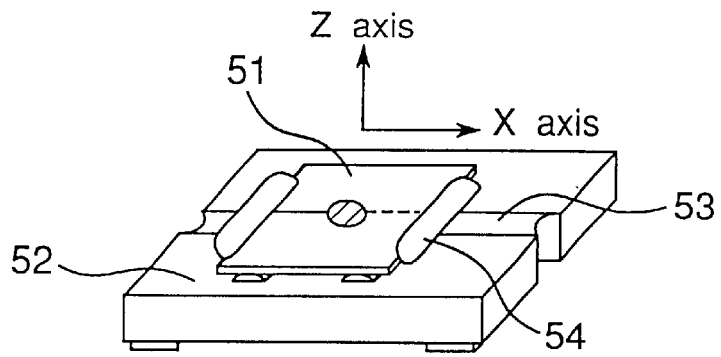
FIG. 15 is a perspective view of a device having a piezoelectric resonator.

The performance of the piezoelectric resonator can be improved further by optimizing a process for mounting it to a print circuit board. FIG. 15 shows a perspective view of a device using the piezoelectric resonator 51 of the first embodiment. The piezoelectric resonator 51 is mounted with an electrically conducting adhesive 54 on a board 52 for connecting to the external. The piezoelectric resonator 51 has electrodes at the top and bottom sides, and the electrodes are connected to the adhesive 54. Further, electrodes 53 are also formed on the board 52, and the adhesives 54 are connected to the electrodes 53. The extension direction of the electrodes 53 and the mounted direction of the resonator 51 agree generally with the X axis direction of the single crystal wafers.

Figure 16A:
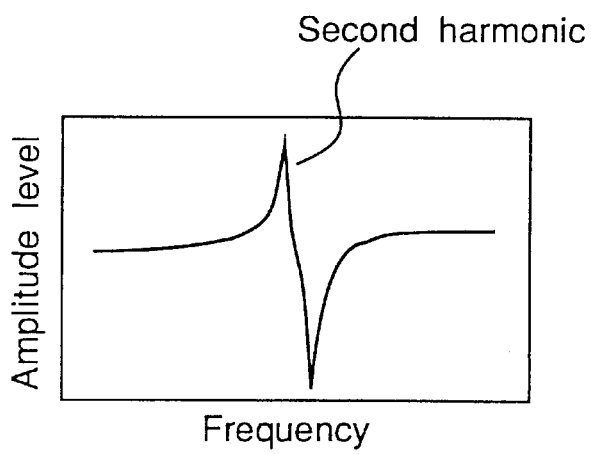
FIGS. 16A and 16B are graphs of frequency characteristics.
Figure 16B:
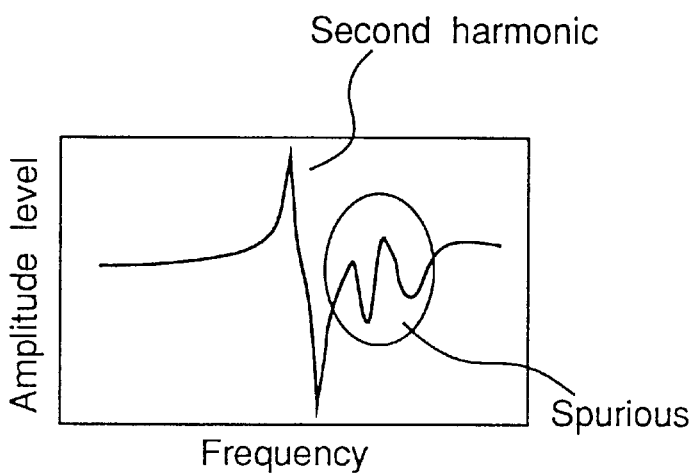

If the extending direction of the electrodes 53 is the Y direction, many spuriouses appear at higher frequencies than the anti-resonance frequency, as shown in FIG. 16B. Therefore, it is preferable that the extending direction of the electrodes 53 is the X direction. Then, a single resonance is observed as shown in FIG. 16A. This feature is also found by using the resonators of the invention having good reproducibility.

As explained above, in the piezoelectric resonator of thickness-extensional mode fabricated with direct bonding by reversing the polarization axis, the thickness is doubled with direct bonding, and the crossing width of the driving electrodes is optimized, and the extending direction of the electrodes is optimized. Then, the piezoelectric resonator has better performance at high frequencies than a prior art resonator.

Figure 17A:
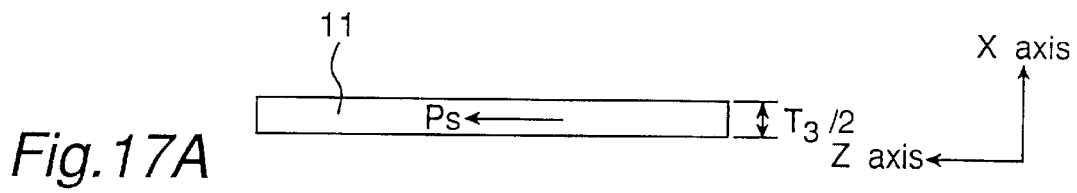
FIGS. 17A, 17B, 17C and 17D are side views for illustrating steps for fabricating a piezoelectric resonator according to a fourth embodiment of the invention.
Figure 17B:
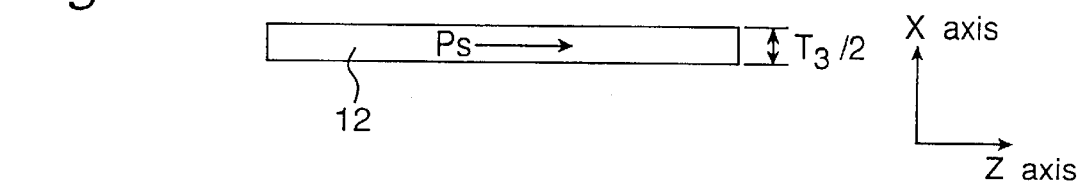
Figure 17C:
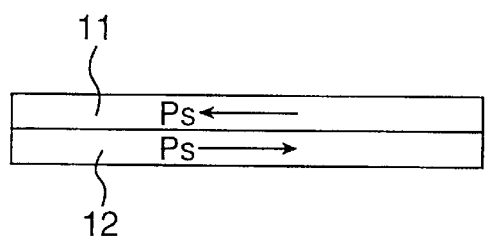
Figure 17D:
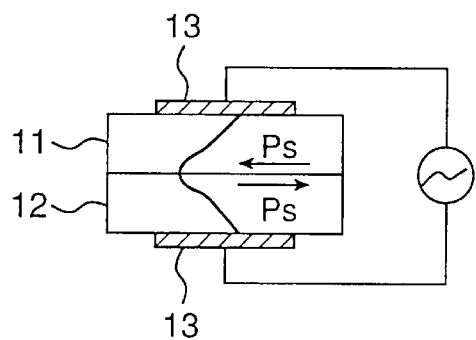

The piezoelectric resonator of the invention is also advantageous for a resonator using thickness shear vibration mode. FIGS. 17A–17D show steps for fabricating a piezoelectric resonator made of X-cut wafers, according to a fourth embodiment. FIG. 17A shows a side view of two piezoelectric single crystal plates 11, 12 of X-cut lithium tantalate having the same thickness "$T_3/2$" of 100 μm and the same diameter of two inches. In FIG. 17A, $P_S$ denotes spontaneous polarization. As explained later, thickness shear vibrations are excited in these plates by opposing electrodes 13. Next, as shown in FIG. 17B, the plates 11 and 12 are integrated with direct bonding with the polarization axes $P_S$ reversed. Then, as shown in FIG. 17C, the driving electrodes 13 are formed on the top and bottom faces of the integrated wafers with reversed polarizations. By dividing the integrated wafers, a piezoelectric resonator shown in FIG. 17D is obtained.

Because the resonator is made by bonding two wafers of the same thickness $T_3/2$, the interface of bonding agrees with the interface of reversed polarization precisely at the position of a half of the thickness. Because the degree of flatness of the interface of reversed polarization is good, resonance of one wavelength can be excited in an ideal state as shown in FIG. 17D. Then, the resonator has small resonance resistance, large dynamic range and very small spuriouses around the resonance frequency. On the other hand, if the polarization axis is parallel to the surface for the X-cut plates, it is difficult to generate an electric field in a direction contributing to the reversed polarization by using the above-mentioned heating and proton exchange. Therefore, it is difficult for the prior art fabrication method to provide the piezoelectric resonator of the invention.

Figure 18A:
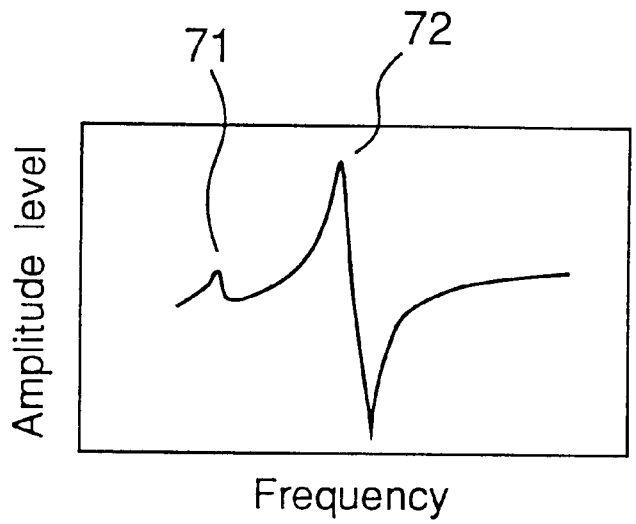
FIGS. 18A and 18B are graphs of frequency characteristic of the piezoelectric resonator according to the sixth embodiment of the invention.
Figure 18B:
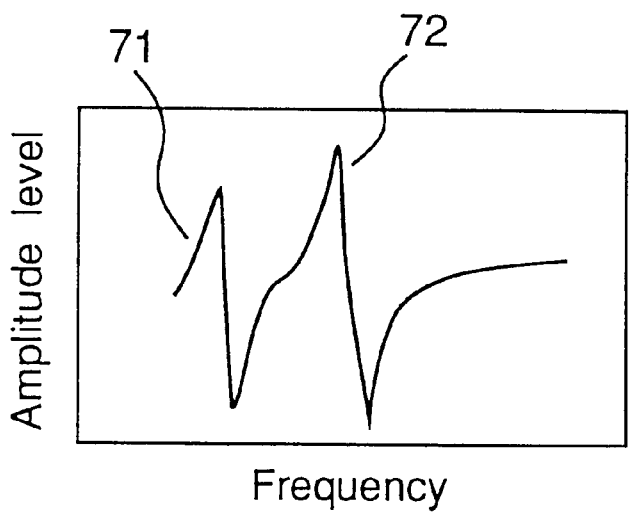

Further, for an x-cut±10° lithium tantalate plate, thickness shear waves (unnecessary waves) having slow sound velocity occur usually which displace perpendicularly to the displacement direction of the thickness shear vibration (main vibration) having faster sound velocity. However, the unnecessary waves can be suppressed with direct bonding by shifting the crystalline axes intentionally. FIG. 18B shows admittance characteristics for direct bonding with matched crystalline axes. Though the total thickness after direct bonding is 200 μm, it is found that a resonance occurs at about 20 MHz which corresponds to thickness shear waves of a single plate of thickness of 100 μm. Further, the resonance is of about the same level at about 16 MHz in correspondence to that of the single plate resonator. The two resonances are the resonance of thickness shear waves having a faster sound velocity and the resonance of thickness shear waves having a slower sound velocity, and the displacement directions thereof are perpendicular to each other.

These resonances are generated essentially for a square or circular element with square or circular electrodes, and it is difficult to suppress them. Previously, in order to solve this problem, for example, a ratio of length to width of the electrodes was changed to prevent trapping of unnecessary waves, or a strip element was provided to suppress excitation of unnecessary waves. However, a high level fabrication technique is needed to form a strip in a thin high frequency element, and the limit of high frequency for such an element is about ten and a few MHz. For example, for an element of 12 MHz band, the optimum size is about 300 μm width, 2.0 mm length and 150 μm height, and it becomes difficult to handle the element.

This problem is solved for the piezoelectric resonator of an embodiment of the invention as follows: FIG. 18A shows admittance characteristics of wafers fabricated with direct bonding with crystalline axes displaced by 1° intentionally. As shown in FIG. 18A, the level of the main wave 71 having a faster sound velocity is about the same but the shear wave 72 having a slower sound velocity or unnecessary waves is suppressed remarkably. This is ascribed to a difference of coupling coefficient of electromechanical coupling coefficient of the two vibration modes. The coupling coefficient of thickness shear vibrations having a faster sound velocity is as large as 47%, while that of thickness shear vibrations having a slower sound velocity is about 6%. Because crystalline axes are shifted intentionally, displacement direction of vibrations excited in each piezoelectric material is shifted and this causes a propagation loss. Thus, vibration waves having a smaller coupling coefficient are suppressed. On the other hand, because vibration waves having a faster sound velocity has a larger coupling coefficient, a shift of the displacement direction is allowed and worsening of characteristics becomes smaller. By using this feature, it becomes possible to effectively suppress unnecessary waves which were difficult suppress previously.

In this embodiment, two X-cut plates are used, and the Z and Y axes thereof are shifted to suppress spuriouses.

However, needless to say, spuriouses can also be suppressed by shifting the X axis. In this case, it is preferable to bond X±10° rotation wafers. For example, by bonding an X+1° rotation wafer to an X−1° rotation wafer, the displacement directions thereof are shifted a little from each other, and unnecessary waves are suppressed. In this case, the X and Y directions may be matched or shifted a little for bonding.

If the shift of angle exceeds ±15°, the properties become worse similarly to the thickness-extensional mode resonator mentioned above. Therefore, it is preferable that the mismatching is within ±15°. More preferably, if the shift is within ±3°, the worsening of the main vibration becomes smaller than suppression of unnecessary waves. Thus, a thickness shear mode resonator having superior properties can be provided.

This feature is particular for direct bonding which can integrate two wafers in a state with crystalline axes shifted a little from each other, and it is not realized only by using the reversed polarization mentioned above.

In the above-mentioned thickness-extensional resonator, the amount of generated spuriouses are small inherently. Therefore, an effect for suppressing spuriouses by shifting the bonding angle is not apparent. However, a new design of the resonator may generate new spuriouses. However, in the fabrication processes explained above, it is possible to bond the wafers with an angle shifted by a desired amount. Therefore, unnecessary vibrations having a small coupling coefficient may be suppressed. A shift of angle of the wafers equal to or larger than 0.1° is sufficient to suppress spuriouses.

In the above-mentioned thickness shear resonator, the integrated body with a reversed polarization has a thickness twice that of a prior art body at the same resonance frequency. Therefore, it is superior because it has higher mechanical strength even if a strip element is fabricated.

Figure 19A:
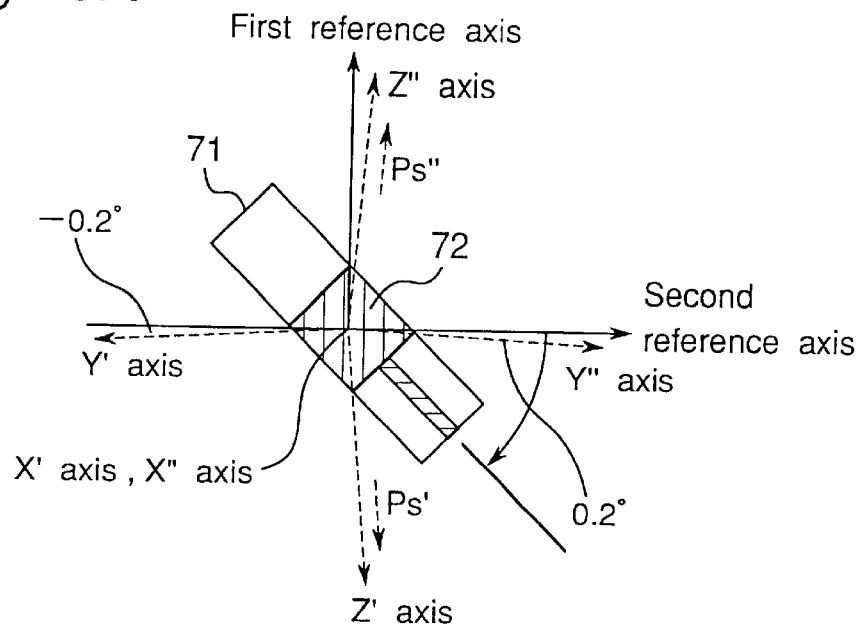
FIGS. 19A and 19B are a top plan view and a perspective view of a piezoelectric resonator according to a fifth embodiment of the invention.

FIG. 19A shows a top plan view of a strip piezoelectric resonator, according to a fifth embodiment. The resonator has a longitudinal piezoelectric bar of directly bonded wafers, and opposing electrodes 72 are formed along the whole width of the bar and have extensions along the longitudinal direction. An X-cut lithium tantalate wafer has its Z' axis (polarization axis) shifted by 0.4° relative to the Z" axis of another X-cut lithium tantalate wafer, and the Z' and Z" axes are reversed generally. The longitudinal direction of the strip resonator is inclined by 0.2° from the axes. The directions of the X axis are determined by the cut face of the wafer, so that they agree with each other generally.

Figure 19B:
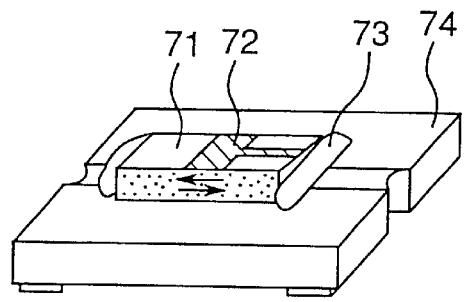

Further, as shown in FIG. 19B, electrodes 72 are formed along the whole width of the principal plane of the piezoelectric element 71 at both sides, while sides in the longitudinal direction are fixed by an electrically conducting adhesive 73 to a print circuit board 74 supporting the piezoelectric resonator 71.

For example, for the above-mentioned device of 12 MHz band having the optimum size of about 300 $\mu$m width, 2.0 mm length and 150 $\mu$m height, the size is increased to about 300 $\mu$m width, 2.0 mm length and 300 $\mu$m height. Then, it becomes easy to handle the device.

Further, by shifting the crystalline axes intentionally, the device has good spurious characteristics, and fabrication precision can be increased.

Figure 20:
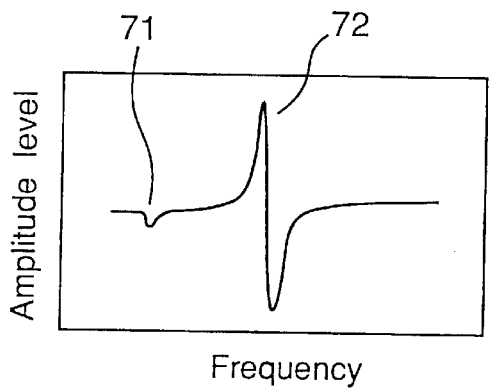
FIG. 20 is a graph of a frequency characteristic of the piezoelectric resonator.

FIG. 20 shows an admittance characteristic of the piezoelectric resonator fabricated by shifting crystalline axes intentionally by 0.40 and by cutting the bonded plates in a direction intermediate between X axes thereof (or 48° in an example) for the strip resonator. It is apparent that good spurious characteristics are observed by suppressing unnecessary waves.

The cut angle is not limited to the above-mentioned value. It is possible to set an angle between 48±10° clockwise relative to the Y axis by considering crystalline symmetry on displacement direction of the main wave. Further, shift angle between the crystalline axes is also admitted within ±15°.

As explained above, a piezoelectric vibrator having a structure with a reversed polarization can be fabricated by using a simple step of direct bonding without using an adhesive. Thus, vibration modes of odd order such as first or third order. Then, the thickness of the piezoelectric resonator can be doubled for the same resonance frequency as the prior art piezoelectric resonator having vibration modes of odd order such as first or third order. Therefore, a piezoelectric resonator having good frequency precision at higher frequencies can be provided by using a known fabrication technique for decreasing the thickness.

Because the handling is easy, the productivity is improved, and the yield of the resonators is increased. By adopting direct bonding, scattering of the thickness of regions with a reversed polarization are suppressed, and the flatness of the boundary of the layers with a reversed polarization is improved. The properties such as resonance resistance and dynamic range are improved.

In the resonator where the crystalline axes are shifted intentionally, a new advantage that spuriouses are suppressed is provided.

Energy trapping in thickness-extensional mode is usually impossible for a piezoelectric material having a Poisson ratio equal to or less than a third. However, for the resonator made of a piezoelectric material fabricated with reversal of polarization and direct bonding according to the invention, the energy trapping becomes possible in the thickness-extensional mode, and generation of spuriouses due to other modes is small.

Further, in a thickness shear resonator having good temperature characteristics, the crystal axes of piezoelectric plates can be shifted intentionally to suppress spuriouses effectively, while the thickness can be increased effectively. Thus, a strip resonator can be provided which is strong and has good spurious characteristics at high frequencies. Needless to say, this holds not only for the strip resonator, but also for a resonator other than a strip resonator.

In the above-mentioned embodiments, the resonators fabricated with direct bonding are explained. However, it is apparent for a person skilled in the art that the abovementioned structures fabricated by using direct bonding can also be applied to a filter.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for fabricating a piezoelectric resonator, comprising:

provising two piezoelectric single crystal plates, each of the two piezoelectric single crystal plates having a direction of spontaneous polarization and having a crystalline axis;

polishing bonding surfaces of each of the two piezoelectric single crystal plates so as to form mirror bonding surfaces;

cleaning the polished bonding surfaces and making the cleaned and polished bonding surfaces hydrophilic;

contacting the cleaned and polished bonding surfaces of the two piezoelectric single crystal plates so that the crystalline axes of the single crystal plates are offset from each other by an angle other than zero, and so that the directions of spontaneous polarization of the single crystal plates are reverse with respect to each other;

heating the contacted single crystal plates to integrate the two single crystal plates; and forming driving electrodes on two principal surfaces of the integrated plates such that the driving electrodes are opposed to each other.

2. The method according to claim 1, wherein the two piezoelectric single crystal plates have the same thicknesses.

3. The method according to claim 1, wherein the two piezoelectric single crystal plates have thicknesses different from each other, the method further comprising:

polishing one side of the integrated two piezoelectric single crystal plates to match the thicknesses of the plates after said heating of the contacted single crystal plates.

4. The method according to claim 1, wherein the two piezoelectric single crystal plates have thicknesses different from each other, the method further comprising:

polishing two sides of the integrated two piezoelectric single crystal plates to match the thicknesses of the plates after said heating of the contacted single crystal plates.

5. The method according to claim 1, wherein said piezoelectric single crystal plates are made of a single crystal material of lithium niobate, lithium tantalate or lithium borate.

6. The method according to claim 1, wherein said contacting of the cleaned and polished bonding surfaces comprises contacting the cleaned and polished bonding surfaces such that the crystalline axes of the single crystal plates are offset from each other by an angle no greater than 15 degrees.

7. The method according to claim 6, wherein the crystalline axis of one of the piezoelectric single crystal plates is perpendicular to the direction of spontaneous polarization of the one of the piezoelectric single crystal plates.

* * * * *